United States Patent
Yamaguchi

(10) Patent No.: US 12,136,614 B2
(45) Date of Patent: Nov. 5, 2024

(54) RADIO FREQUENCY MODULE AND COMMUNICATION APPARATUS

(71) Applicant: Murata Manufacturing Co., Ltd., Nagaokakyo (JP)

(72) Inventor: Yukiya Yamaguchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 361 days.

(21) Appl. No.: 17/673,785

(22) Filed: Feb. 17, 2022

(65) Prior Publication Data

US 2022/0173086 A1 Jun. 2, 2022

Related U.S. Application Data

(63) Continuation of application No. PCT/JP2020/024599, filed on Jun. 23, 2020.

(30) Foreign Application Priority Data

Aug. 30, 2019 (JP) .................... 2019-158613

(51) Int. Cl.

| | |
|---|---|
| *H04B 1/40* | (2015.01) |
| *H01L 23/498* | (2006.01) |
| *H01L 23/66* | (2006.01) |
| *H01L 25/16* | (2023.01) |
| *H03H 9/05* | (2006.01) |

(52) U.S. Cl.
CPC ........ *H01L 25/16* (2013.01); *H01L 23/49827* (2013.01); *H01L 23/66* (2013.01); *H03H 9/0552* (2013.01); *H04B 1/40* (2013.01); *H01L 2223/6616* (2013.01); *H01L 2223/6655* (2013.01)

(58) Field of Classification Search
CPC ... H04B 1/04; H04B 1/38; H04B 1/44; H04B 1/40; H04B 1/02; H04B 1/3827; H04B 1/034; H01Q 1/12; H01Q 1/38; H01Q 1/52; H05K 1/00; H05K 1/11; H05K 1/18
See application file for complete search history.

(56) References Cited

U.S. PATENT DOCUMENTS

2003/0201939 A1* 10/2003 Reece ................... H01Q 21/24
343/700 MS
2007/0058748 A1* 3/2007 Kim ........................ H04B 1/52
375/295

FOREIGN PATENT DOCUMENTS

| JP | 2015-111748 A | 6/2015 |
| WO | 00/28673 A1 | 5/2000 |

OTHER PUBLICATIONS

English Translation of Written Opinion issued Sep. 29, 2020, in corresponding International Application No. PCT/JP2020/024599, 4 pp.

(Continued)

*Primary Examiner* — Tu X Nguyen
(74) *Attorney, Agent, or Firm* — XSENSUS LLP

(57) ABSTRACT

A radio frequency module includes a module substrate having main surfaces facing each other and enabling radio frequency components to be mounted on both main surfaces, a power amplifier configured to amplify transmission signals in a cellular band, and a low noise amplifier configured to amplify GPS reception signals. The power amplifier and the low noise amplifier are mounted on the same module substrate.

19 Claims, 6 Drawing Sheets

(56) References Cited

OTHER PUBLICATIONS

International Search Report and Written Opinion mailed on Sep. 29, 2020, received for PCT Application PCT/JP2020/024599, Filed on Jun. 23, 2020, 9 pages including English Translation.

\* cited by examiner

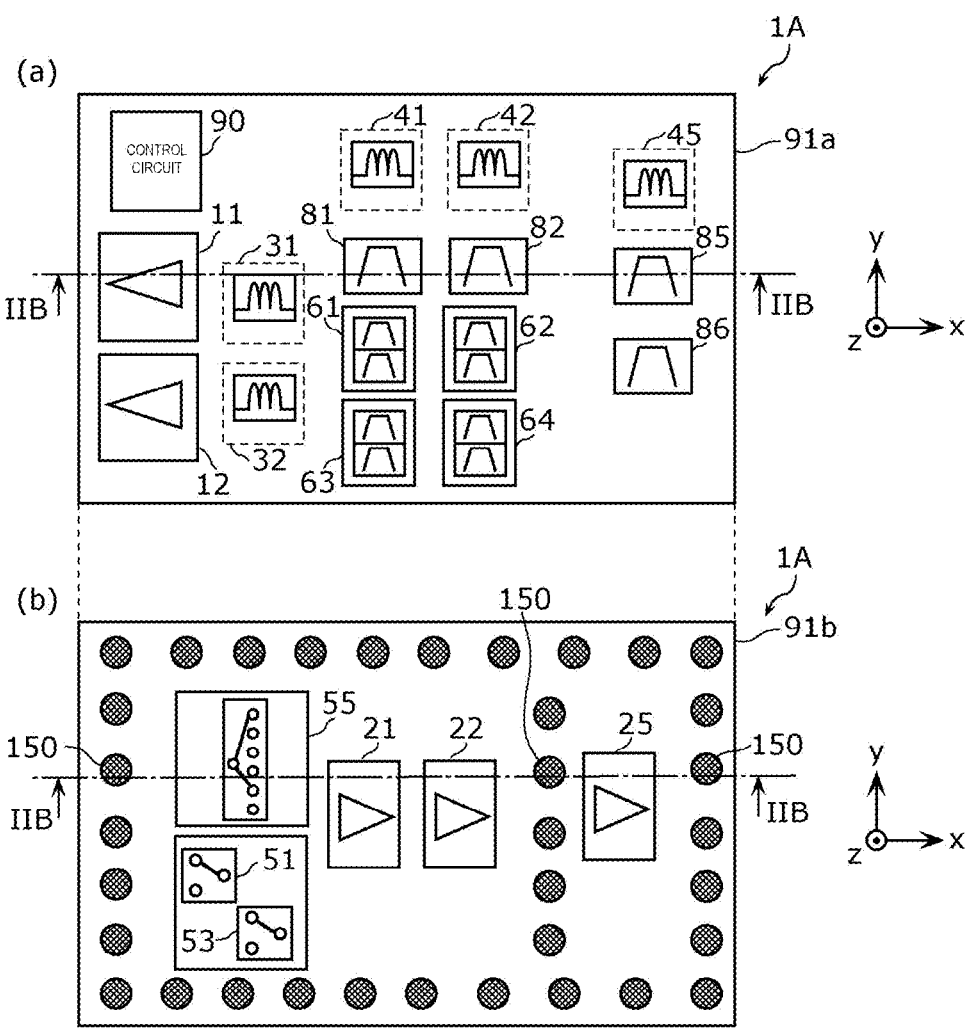

RADIO FREQUENCY MODULE AND COMMUNICATION APPARATUS

CROSS-REFERENCE TO RELATED APPLICATIONS

This application claims priority to PCT/JP2020/024599, filed Jun. 23, 2020, which claims priority to JP 2019-158613, filed Aug. 30, 2019, the contents of both of which are incorporated by reference in their entirety.

TECHNICAL FIELD

The present relates to a radio frequency module and a communication apparatus.

BACKGROUND

In mobile communication apparatuses such as cellular phones, modularization and miniaturization of radio frequency front-end circuits compatible with frequency bands of a fourth generation mobile communication system (4G) and a fifth generation mobile communication system (5G) are required with development of multi-banding, in particular.

Conventionally, a semiconductor module may have a configuration in which a filter is mounted on an upper surface of a double-sided mountable wiring substrate and a transmission power amplifier and a reception low noise amplifier are mounted on a lower surface of the wiring substrate.

SUMMARY

A radio frequency module according to an aspect of the disclosure includes a mounting substrate having a first main surface and a second main surface that face each other; a first transmission power amplifier configured to amplify a transmission signal in a cellular band; and a second reception low noise amplifier configured to amplify a global positioning system (GPS) reception signal. The first transmission power amplifier and the second reception low noise amplifier are mounted on the mounting substrate.

BRIEF DESCRIPTION OF DRAWINGS

FIG. 2A is a schematic plan configuration diagram of a radio frequency module according to an example.

DETAILED DESCRIPTION OF THE DRAWINGS

Figure 1:
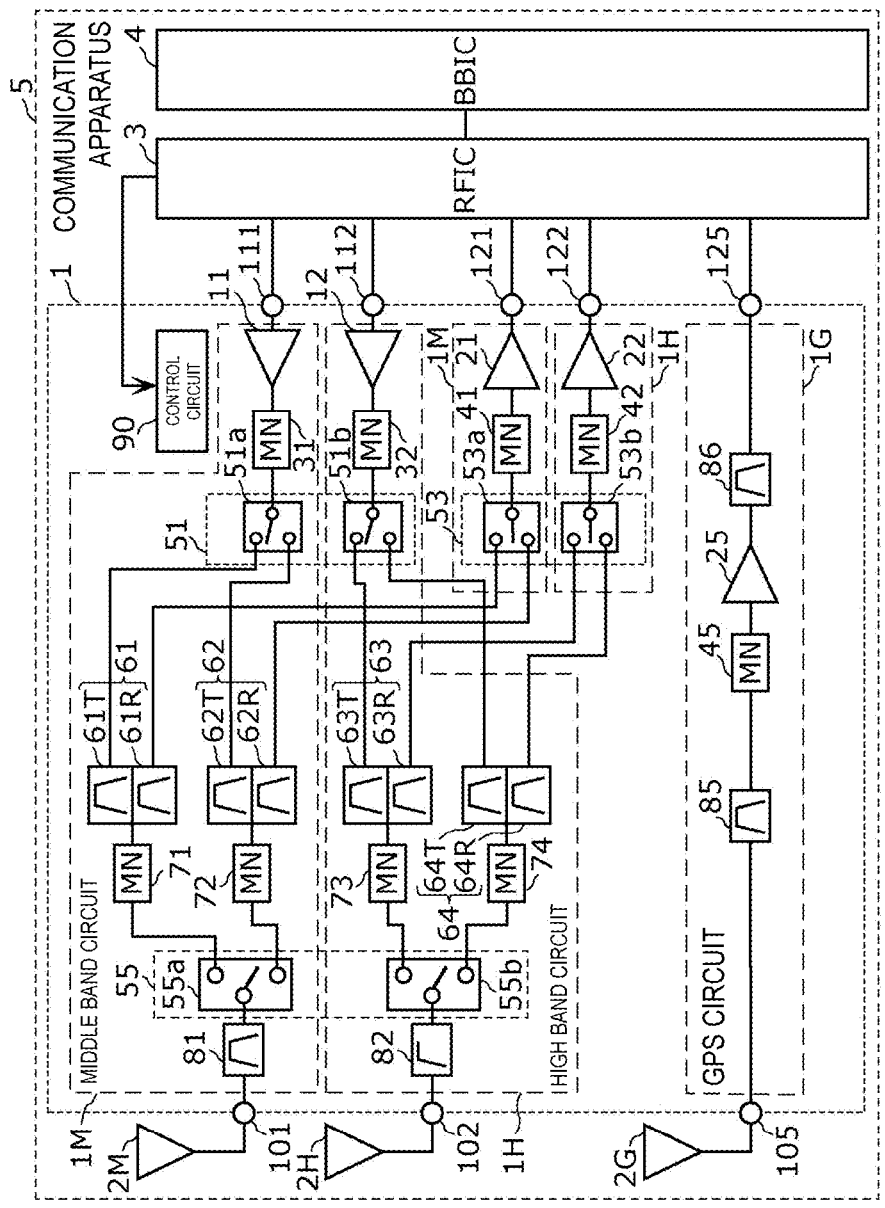
FIG. 1 is a circuit configuration diagram of a radio frequency module and a communication apparatus according to an embodiment.

The inventors of the present disclosure have recognized that there is a demand for a small-sized front-end circuit in which a transmission circuit corresponding to a cellular band of 4G and 5G and a reception circuit of the global positioning system (GPS) coexist.

The inventors have developed technology as detailed in this disclosure to provide a small-sized radio frequency module and a small-sized communication apparatus in which a transmission circuit corresponding to a cellular band of 4G and 5G and a GPS reception circuit coexist.

Hereinafter, an embodiment of the disclosure will be described in detail with reference to an example and a variation. It should be noted that all of the example and the variation described below represent comprehensive or specific examples. Numerical values, shapes, materials, constituent elements, arrangements and connection forms of the constituent elements, and the like described in the following example and variation are examples and are not intended to limit the present disclosure. Among the constituent elements in the following example and variation, constituent elements not recited in independent claims are described as arbitrary constituent elements. In addition, the sizes or size ratios of the constituent elements illustrated in the drawings are not necessarily strict.

In the following embodiment, as for A, B, and C mounted on a substrate, an expression "C is arranged between A and B when the substrate (or the main surface of the substrate) is viewed in plan" is defined to indicate that at least a part of a region of C projected when the substrate is viewed in plan overlaps with a line connecting an arbitrary point in a region of A projected when the substrate is viewed in plan (when the substrate is viewed from the normal direction of the substrate) and an arbitrary point in a region of B projected when the substrate is viewed in plan.

Embodiment

1. Circuit Configuration of Radio Frequency Module 1 and Communication Apparatus 5

FIG. 1 is a circuit configuration diagram of a radio frequency module 1 and a communication apparatus 5 according to a first embodiment. As illustrated in the drawing, the communication apparatus 5 includes the radio frequency module 1, antennas 2G, 2H, and 2M, an RF signal processing circuit (RFIC) 3, and a baseband signal processing circuit (BBIC) 4.

The RFIC 3 is an RF signal processing circuit configured to process radio frequency signals that are transmitted and received by the antennas 2G, 2H, and 2M. To be specific, the RFIC 3 processes radio frequency reception signals input while passing through a reception signal path of the radio frequency module 1 by down-conversion or the like and outputs reception signals generated by the signal processing to the BBIC 4. Further, the RFIC 3 processes transmission signals input from the BBIC 4 by up-conversion or the like and outputs radio frequency transmission signals generated by the signal processing to a transmission signal path of the radio frequency module 1.

The BBIC 4 is a circuit configured to perform signal processing using an intermediate frequency band lower than radio frequency signals propagating through the radio frequency module 1. A signal processed by the BBIC 4 is used, for example, as an image signal for image display or as an audio signal for a telephone call with a loudspeaker.

The RFIC 3 also has a function as a controller that controls connection of switch circuits 51, 53, and 55 included in the radio frequency module 1 based on a communication band to be used. Specifically, the controller transmits control signals for switching the connection of the switch circuits 51, 53, and 55 included in the radio frequency module 1 to a control circuit 90 of the radio frequency module 1. Further, the controller transmits control signals for adjusting gains and the like of power amplifiers 11 and 12 and low noise amplifiers 21, 22, and 25 of the radio frequency module 1 to the control circuit 90. In response to these control signals, the control circuit 90 outputs control signals to the switch circuits 51, 53, and 55, the power amplifiers 11 and 12, and the low noise amplifiers 21, 22, and 25. The control circuit 90 may be a circuit that controls at least one of the switch circuits 51, 53, and 55, the power amplifiers 11 and 12, and the low noise amplifiers 21, 22, and 25. Further, the controller may be provided outside the RFIC 3, for example, may be provided in the BBIC 4.

The antenna 2M is connected to an antenna connection terminal 101 of the radio frequency module 1, radiates transmission signals output from a middle band circuit 1M of the radio frequency module 1, and receives reception signals from the outside and outputs the reception signals to the middle band circuit 1M.

The antenna 2H is connected to an antenna connection terminal 102 of the radio frequency module 1, radiates transmission signals output from a high band circuit 1H of the radio frequency module 1, and receives reception signals from the outside and outputs the reception signals to the high band circuit 1H.

The antenna 2G is connected to an antenna connection terminal 105 of the radio frequency module 1, and receives GPS signals from the outside and outputs the reception signals to a GPS circuit 1G.

Next, a detailed configuration of the radio frequency module 1 will be described.

As illustrated in FIG. 1, the radio frequency module 1 includes the antenna connection terminals 101, 102, and 105, the middle band circuit 1M, the high band circuit 1H, the GPS circuit 1G, the control circuit 90, transmission input terminals 111 and 112, and reception output terminals 121, 122, and 125.

The antenna connection terminal 101 is connected to the antenna 2M, the antenna connection terminal 102 is connected to the antenna 2H, and the antenna connection terminal 105 is connected to the antenna 2G.

The middle band circuit 1M is a circuit that transmits transmission signals and reception signals in communication bands belonging to a middle band group. The high band circuit 1H is a circuit that transmits transmission signals and reception signals in communication bands belonging to a high band group. The GPS circuit 1G is a circuit that receives reception signals in a GPS band.

The middle band group is a part of a cellular band, is a frequency band group formed by a plurality of communication bands corresponding to 4G and 5G, and has a frequency range of 1.5 to 2.2 GHz, for example. The middle band group includes communication bands such as Band 1 (transmission band: 1920 to 1980 MHz, reception band: 2110 to 2170 MHz), Band 39 (transmission/reception band: 1880 to 1920 MHz), and Band 66 (transmission band: 1710 to 1780 MHz, reception band: 2110 to 2200 MHz) of LTE, for example.

The high band group is a part of the cellular band, is a frequency band group formed by a plurality of communication bands corresponding to 4G and 5G, is on the higher frequency side than the middle band group, and has a frequency range of 2.4 to 2.8 GHz, for example. The high band group includes communication bands such as Band 7 (transmission band: 2500 to 2570 MHz, reception band: 2620 to 2690 MHz) and Band 41 (transmission/reception band: 2496 to 2690 MHz), for example.

The GPS band is, for example, a frequency band having a band width of 2.046 MHz with a center frequency being 1.57542 GHz. The GPS circuit 1G is a circuit that receives GPS signals from GPS satellites and transmits them to the RFIC 3. Since it is necessary for the GPS circuit 1G to receive weak GPS signals from the GPS satellites with high accuracy, pass characteristics required for the GPS circuit 1G are strict. For the GPS band, required values of the attenuations of the middle band group and the high band group in the cellular band are 35 to 55 dB, for example.

The middle band circuit 1M includes the power amplifier 11, the low noise amplifier 21, a filter 81, duplexers 61 and 62, matching circuits 31, 41, 71, and 72, and switches 51*a*, 53*a*, and 55*a*.

The power amplifier 11 is an example of a first transmission power amplifier and amplifies the transmission signals in the communication bands belonging to the middle band group. The low noise amplifier 21 is an example of a first reception low noise amplifier and amplifies the reception signals in the communication bands belonging to the middle band group with low noise.

The filter 81 is an example of a third filter, is connected between the antenna connection terminal 101 and the switch 55*a*, uses the frequency range of the middle band group as a pass band, and transmits both the transmission signals and the reception signals in the middle band group.

The duplexer 61 transmits radio frequency signals in a communication band A of the middle band group and includes a transmission filter 61T (first transmission filter) and a reception filter 61R (first reception filter). The transmission filter 61T is arranged on a transmission path connecting the power amplifier 11 and the antenna connection terminal 101 and transmits transmission signals in a transmission band of the communication band A among the transmission signals amplified by the power amplifier 11. The reception filter 61R is arranged on a reception path connecting the low noise amplifier 21 and the antenna connection terminal 101 and transmits reception signals in a reception band of the communication band A among the reception signals input from the antenna connection terminal 101.

The duplexer 62 transmits radio frequency signals in a communication band B of the middle band group and includes a transmission filter 62T (first transmission filter) and a reception filter 62R (first reception filter). The transmission filter 62T is arranged on a transmission path connecting the power amplifier 11 and the antenna connection terminal 101 and transmits transmission signals in a transmission band of the communication band B among the transmission signals amplified by the power amplifier 11. The reception filter 62R is arranged on a reception path connecting the low noise amplifier 21 and the antenna connection terminal 101 and transmits reception signals in a reception band of the communication band B among the reception signals input from the antenna connection terminal 101.

The matching circuit 31 is arranged on a transmission path connecting the power amplifier 11 and the transmission filters 61T and 62T and performs impedance matching between the power amplifier 11 and the switch 51*a* and the transmission filters 61T and 62T. The matching circuit 41 is arranged on a reception path connecting the low noise amplifier 21 and the reception filters 61R and 62R and performs impedance matching between the low noise amplifier 21 and the switch 53*a* and the reception filters 61R and 62R. The matching circuit 71 is arranged on a path connecting the switch 55*a* and the duplexer 61 and performs impedance matching between the filter 81 and the switch 55*a* and the duplexer 61. The matching circuit 72 is arranged on a path connecting the switch 55*a* and the duplexer 62 and performs impedance matching between the filter 81 and the switch 55*a* and the duplexer 62.

The switch 51*a* is an example of a first switch, is arranged on a transmission path connecting the matching circuit 31 and the transmission filters 61T and 62T, and switches connection between the power amplifier 11 and the transmission filter 61T and connection between the power amplifier 11 and the transmission filter 62T. The switch 51*a* is configured by, for example, a single pole double throw (SPDT)-type switch circuit in which a common terminal is connected to the matching circuit 31, one selection terminal is connected to the transmission filter 61T, and the other selection terminal is connected to the transmission filter 62T.

The switch 53*a* is an example of a second switch, is arranged on a reception path connecting the matching circuit 41 and the reception filters 61R and 62R, and switches connection between the low noise amplifier 21 and the reception filter 61R and connection between the low noise amplifier 21 and the reception filter 62R. The switch 53*a* is configured by, for example, an SPDT switch circuit in which a common terminal is connected to the matching circuit 41, one selection terminal is connected to the reception filter 61R, and the other selection terminal is connected to the reception filter 62R.

The switch 55*a* switches connection between the filter 81 and the matching circuit 71 and connection between the filter 81 and the matching circuit 72. The switch 55*a* is configured by, for example, an SPDT switch circuit in which a common terminal is connected to the filter 81, one selection terminal is connected to the matching circuit 71, and the other selection terminal is connected to the matching circuit 72. In addition, the switch 55*a* can prevent the radio frequency signals in the middle band group from being transmitted through the middle band circuit 1M by connecting the common terminal to none of the selection terminals. That is, the switch 55*a* is an antenna switch that switches connection and disconnection between the middle band circuit 1M and the antenna 2M.

In the middle band circuit 1M, the number of communication bands to be transmitted is not limited to two and may be one or equal to or more than three. The necessity of the filter 81, the number of duplexers, the number of matching circuits, and the necessities of the respective switches are determined in accordance with the number of communication bands.

The high band circuit 1H includes the power amplifier 12, the low noise amplifier 22, a high pass filter 82, duplexers 63 and 64, matching circuits 32, 42, 73 and 74, and switches 51*b*, 53*b* and 55*b*.

The power amplifier 12 is an example of the first transmission power amplifier and amplifies the transmission signals in the communication bands belonging to the high band group. The low noise amplifier 22 is an example of the first reception low noise amplifier and amplifies the reception signals in the communication bands belonging to the high band group with low noise.

The high pass filter 82 is an example of the third filter, is connected between the antenna connection terminal 102 and the switch 55*b*, uses the frequency range of the high band group as a pass band, and transmits both the transmission signals and the reception signals in the high band group. Note that the high pass filter 82 may be a band pass filter whose pass band is the frequency range of the high band group.

The duplexer 63 transmits radio frequency signals in a communication band C of the high band group and includes a transmission filter 63T (first transmission filter) and a reception filter 63R (first reception filter). The transmission filter 63T is arranged on a transmission path connecting the power amplifier 12 and the antenna connection terminal 102 and transmits transmission signals in a transmission band of the communication band C among the transmission signals amplified by the power amplifier 12. The reception filter 63R is arranged on a reception path connecting the low noise amplifier 22 and the antenna connection terminal 102 and transmits reception signals in a reception band of the communication band C among the reception signals input from the antenna connection terminal 102.

The duplexer 64 transmits radio frequency signals in a communication band D of the high band group and includes a transmission filter 64T (first transmission filter) and a reception filter 64R (first reception filter). The transmission filter 64T is arranged on a transmission path connecting the power amplifier 12 and the antenna connection terminal 102 and transmits transmission signals in a transmission band of the communication band D among the transmission signals amplified by the power amplifier 12. The reception filter 64R is arranged on a reception path connecting the low noise amplifier 22 and the antenna connection terminal 102 and transmits reception signals in a reception band of the communication band D among the reception signals input from the antenna connection terminal 102.

The matching circuit 32 is arranged on a transmission path connecting the power amplifier 12 and the transmission filters 63T and 64T and performs impedance matching between the power amplifier 12 and the switch 51*b* and the transmission filters 63T and 64T. The matching circuit 42 is arranged on a reception path connecting the low noise amplifier 22 and the reception filters 63R and 64R and performs impedance matching between the low noise amplifier 22 and the switch 53*b* and the reception filters 63R and 64R. The matching circuit 73 is arranged on a path connecting the switch 55*b* and the duplexer 63 and performs impedance matching between the high pass filter 82 and the switch 55*b* and the duplexer 63. The matching circuit 74 is arranged on a path connecting the switch 55*b* and the duplexer 64 and performs impedance matching between the high pass filter 82 and the switch 55*b* and the duplexer 64.

The switch 51*b* is an example of the first switch, is arranged on a transmission path connecting the matching circuit 32 and the transmission filters 63T and 64T, and switches connection between the power amplifier 12 and the transmission filter 63T and connection between the power amplifier 12 and the transmission filter 64T. The switch 51*b* is configured by, for example, an SPDT switch circuit in which a common terminal is connected to the matching circuit 32, one selection terminal is connected to the transmission filter 63T, and the other selection terminal is connected to the transmission filter 64T.

The switch 53*b* is an example of the second switch, is arranged on a reception path connecting the matching circuit 42 and the reception filters 63R and 64R, and switches connection between the low noise amplifier 22 and the reception filter 63R and connection between the low noise amplifier 22 and the reception filter 64R. The switch 53*b* is configured by, for example, an SPDT switch circuit in which a common terminal is connected to the matching circuit 42, one selection terminal is connected to the reception filter 63R, and the other selection terminal is connected to the reception filter 64R.

The switch 55b switches connection between the high pass filter 82 and the matching circuit 73 and connection between the high pass filter 82 and the matching circuit 74. The switch 55b is configured by, for example, an SPDT switch circuit in which a common terminal is connected to the high pass filter 82, one selection terminal is connected to the matching circuit 73, and the other selection terminal is connected to the matching circuit 74. In addition, the switch 55b can prevent the radio frequency signals in the high band group from being transmitted through the high band circuit 1H by connecting the common terminal to none of the selection terminals. That is, the switch 55b is an antenna switch that switches connection and disconnection between the high band circuit 1H and the antenna 2H.

In the high band circuit 1H, the number of communication bands to be transmitted is not limited to two and may be one or equal to or more than three. The necessity of the high pass filter 82, the number of duplexers, the number of matching circuits, and the necessities of the respective switches are determined in accordance with the number of communication bands.

The GPS circuit 1G includes the low noise amplifier 25, filters 85 and 86, and a matching circuit 45.

The low noise amplifier 25 is an example of a second reception low noise amplifier and amplifies the reception signals in the GPS band with low noise.

The filter 85 is an example of a second reception filter, is connected between the antenna connection terminal 105 and the matching circuit 45, uses the GPS band as a pass band, and uses the cellular band whose frequencies are different from those of the GPS band as an attenuation band. The filter 86 is an example of the second reception filter, is connected between the low noise amplifier 25 and the reception output terminal 125, uses the GPS band as a pass band, and uses the cellular band whose frequencies are different from those of the GPS band as an attenuation band. In the GPS circuit 1G in the embodiment, the filters are arranged at the front stage and the rear stage of the low noise amplifier 25, respectively, in order to satisfy the required value of the attenuation of the cellular band.

The matching circuit 45 is arranged on a reception path of the GPS circuit 1G and performs impedance matching between the low noise amplifier 25 and the filter 85.

In the radio frequency module 1, the switches 55a and 55b may be configured by one switch circuit 55. In this case, the switch circuit 55 is a multi-connection switch circuit capable of simultaneously connecting equal to or more than one of the middle band circuit 1M and the high band circuit 1H to the antenna.

In addition, each of the filters 81, 85, and 86, the high pass filter 82, the transmission filters 61T to 64T, and the reception filters 61R to 64R may be, for example, any one of a surface-acoustic-wave filter, an elastic wave filter using a bulk acoustic wave (BAW), an LC resonance filter, and a dielectric filter, and is not limited thereto.

Further, the antennas 2M and 2H may be one antenna. In this case, the above-described one antenna has antenna characteristics capable of radiating (transmitting) and receiving the radio frequency signals in the middle band group and the high band group. Moreover, in this case, the filter 81 and the high pass filter 82 configure a diplexer commonly connected to the above-described one antenna.

In addition, each of the power amplifiers 11 and 12 and the low noise amplifiers 21, 22, and 25 is configured by, for example, a field effect transistor (FET) or a heterobipolar transistor (HBT) using Si-based complementary metal oxide semiconductor (CMOS) or GaAs as a material.

The low noise amplifiers 21 and 22 and the switch circuits 51, 53, and 55 may be formed in one semiconductor integrated circuit (IC). Furthermore, the above-described semiconductor IC may further include the power amplifiers 11 and 12. The semiconductor IC is formed of, for example, CMOS. Specifically, the semiconductor IC is formed by a silicon on insulator (SOI) process. Thus, the semiconductor IC can be manufactured at low cost. The semiconductor IC may be formed of at least any one of GaAs, SiGe, and GaN. This makes it possible to output radio frequency signals having high-quality amplification performance and noise performance.

With the above-described circuit configuration, the radio frequency module 1 according to the embodiment can execute, by the middle band circuit 1M and the high band circuit 1H, at least one of transmission, reception, and transmission and reception of the radio frequency signals in any one communication band among the communication bands A to D belonging to the cellular band by the communication band alone. In addition, the radio frequency module 1 can execute at least any one of simultaneous transmission, simultaneous reception, and simultaneous transmission and reception of the radio frequency signals in equal to or more than two communication bands among the communication bands A to D. Further, the radio frequency module 1 can receive the GPS signals by the GPS circuit 1G independently of the middle band circuit 1M and the high band circuit 1H.

In the above-described circuit configuration, the radio frequency module 1 includes the middle band circuit 1M and the high band circuit 1H. However, the radio frequency module 1 according to the embodiment may include a low band circuit. The low band circuit is a circuit that transmits radio frequency signals in a low band group located on the lower frequency side than the middle band group.

In addition, each of the duplexers 61 to 64 may have a configuration corresponding to a so-called time division duplex system including a filter for both transmission and reception and a transmission/reception switch.

In recent years, there has been a demand for a small-sized front-end circuit in which a transmission circuit corresponding to the cellular band of 4G and 5G and a GPS reception circuit coexist.

In response to this demand, the radio frequency module 1 according to the embodiment realizes a small-sized module in which the transmission circuit corresponding to the cellular band and the GPS reception circuit coexist. Hereinafter, a configuration for miniaturization of the radio frequency module 1 according to the embodiment will be described.

Figure 2B:
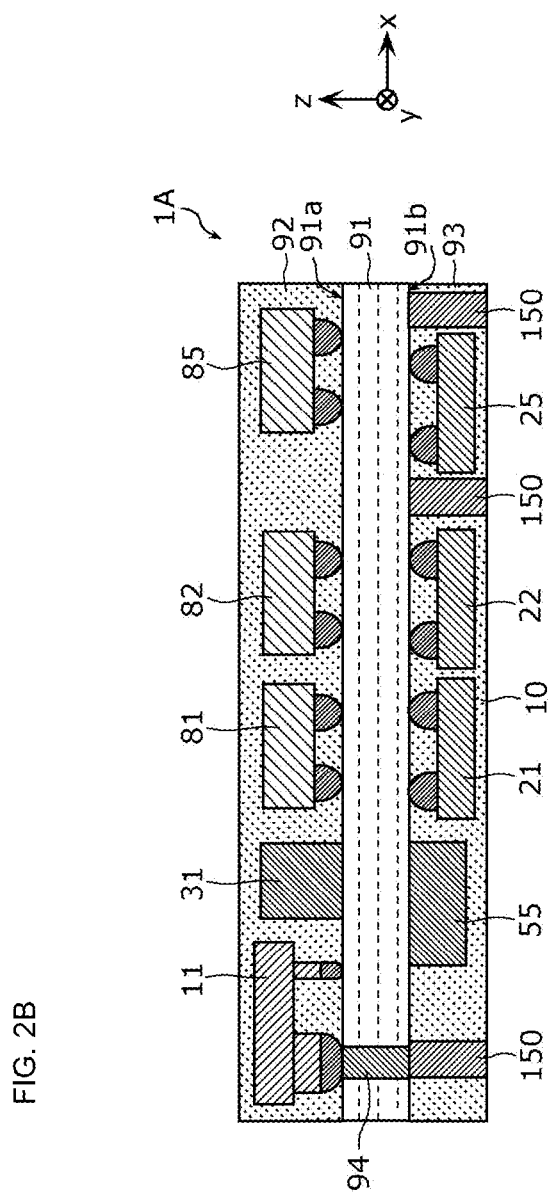
FIG. 2B is a schematic sectional configuration diagram of the radio frequency module in the example.

2. Circuit Element Arrangement Configuration of Radio Frequency Module 1A According to Example FIG. 2A is a schematic plan configuration diagram of a radio frequency module 1A according to an example. FIG. 2B is a schematic sectional configuration diagram of the radio frequency module 1A in the example, and specifically, is a sectional view along line IIB-IIB in FIG. 2A. (a) in FIG. 2A illustrates an arrangement diagram of circuit elements when a main surface 91a of main surfaces 91a and 91b of a module substrate 91, which face each other, is viewed from the positive z-axis direction side. On the other hand, (b) in FIG. 2A illustrates a perspective view of arrangement of the circuit elements when the main surface 91b is viewed from the z-axis positive direction side.

In the radio frequency module 1A in the example, the arrangement configuration of the circuit elements configuring the radio frequency module 1 in the embodiment is specifically indicated.

As illustrated in FIGS. 2A and 2B, the radio frequency module 1A in the example further includes the module substrate 91 and resin members 92 and 93 in addition to the circuit configuration illustrated in FIG. 1.

The module substrate 91 is a mounting substrate having the main surface 91a (first main surface) and the main surface 91b (second main surface) facing each other, the middle band circuit 1M and the high band circuit 1H being mounted on the mounting substrate. As the module substrate 91, for example, a low temperature co-fired ceramics (LTCC) substrate having a laminated structure of a plurality of dielectric layers, a printed substrate, or the like is used.

The resin member 92 is arranged on the main surface 91a of the module substrate 91, covers a part of the middle band circuit 1M, a part of the high band circuit 1H, a part of the GPS circuit 1G, and the main surface 91a of the module substrate 91, and has a function of ensuring reliability such as mechanical strength and moisture resistance of the circuit elements configuring the middle band circuit 1M, the high band circuit 1H, and the GPS circuit 1G.

The resin member 93 is arranged on the main surface 91b of the module substrate 91, covers a part of the middle band circuit 1M, a part of the high band circuit 1H, a part of the GPS circuit 1G, and the main surface 91b of the module substrate 91, and has a function of ensuring reliability such as mechanical strength and moisture resistance of the circuit elements configuring the middle band circuit 1M, the high band circuit 1H, and the GPS circuit 1G.

As illustrated in FIGS. 2A and 2B, in the radio frequency module 1A in the example, the power amplifiers 11 and 12, the filters 81, 85, and 86, the high pass filter 82, the duplexers 61 to 64, the matching circuits 31, 32, 41, 42, and 45, and the control circuit 90 are surface-mounted on the main surface 91a of the module substrate 91. On the other hand, the low noise amplifiers 21, 22, and 25 and the switch circuits 51, 53, and 55 are surface-mounted on the main surface 91b of the module substrate 91. The matching circuits 71 to 74 may be surface-mounted on any one of the main surfaces 91a and 91b of the module substrate 91 or may be incorporated in the module substrate 91.

The power amplifier 11 is an example of a first transmission power amplifier that amplifies the transmission signals in the middle band group and is mounted on the main surface 91a of the module substrate 91. The power amplifier 12 is an example of the first transmission power amplifier that amplifies the transmission signals in the high band group and is mounted on the main surface 91a of the module substrate 91. The low noise amplifier 25 is an example of a second reception low noise amplifier that amplifies the GPS signals and is mounted on the main surface 91b of the module substrate 91.

In the radio frequency module 1A in the example, the power amplifiers 11 and 12 that amplify the transmission signals in the cellular band and the low noise amplifier 25 that amplifies the GPS reception signals are mounted on the same module substrate 91. This configuration can provide the small-sized radio frequency module 1A as compared with a conventional configuration in which a power amplifier that amplifies transmission signals in the cellular band and a low noise amplifier that amplifies GPS reception signals are mounted on separate mounting substrates.

In the radio frequency module 1A in the example, the power amplifiers 11 and 12 are mounted on the main surface 91a, and the low noise amplifier 25 is mounted on the main surface 91b. The radio frequency module 1A can thereby be further reduced in size as compared with the case where the power amplifiers 11 and 12 having large mounting areas and the low noise amplifier 25 are mounted and arranged on the same mounting surface. In addition, since the module substrate 91 is interposed between the power amplifiers 11 and 12 and the low noise amplifier 25, deterioration in GPS reception sensitivity due to interference of high-power transmission signals in the cellular band with the GPS signals requiring high signal to noise ratios can be suppressed.

In the radio frequency module 1A in the example, the filter 81, the high pass filter 82, and the duplexers 61 to 64 are examples of a conductive member and are mounted on the main surface 91a of the module substrate 91. In plan view of the module substrate 91, the filter 81, the high pass filter 82, and the duplexers 61 and 62 are arranged between the power amplifier 11 and the low noise amplifier 25. In the above-described plan view, a distance between the power amplifier 11 and the low noise amplifier 25 can therefore be largely ensured for the sizes of the above-described conductive members, so that the conductive members can be used as shield members between the power amplifier 11 and the low noise amplifier 25. Signal interference between the power amplifier 11 in the middle band group and the low noise amplifier 25 in the GPS band can thereby be suppressed. Further, in the above-described plan view, the duplexers 61 to 63 are arranged between the power amplifier 12 and the low noise amplifier 25. In the above-described plan view, a distance between the power amplifier 12 and the low noise amplifier 25 can therefore be largely ensured for the sizes of the above-described conductive members, so that the conductive members can be used as shield members between the power amplifier 12 and the low noise amplifier 25. Signal interference between the power amplifier 12 in the high band group and the low noise amplifier 25 in the GPS band can thereby be suppressed.

The conductive member arranged between the power amplifiers 11 and 12 and the low noise amplifier 25 may be at least one of the filter 81, the high pass filter 82, and the duplexers 61 to 64. The above-described conductive member may be at least any one of the transmission filter and the reception filter configuring each of the duplexers 61 to 64. The filter 81, the high pass filter 82, and the transmission filter and the reception filter configuring each of the duplexers 61 to 64 have a plurality of conductive members such as signal extraction electrodes. For example, at least one of the plurality of signal extraction electrodes is connected to a ground pattern arranged on the module substrate 91. With this configuration, unnecessary waves of transmission signals generated from the power amplifiers 11 and 12 can be shielded by the above-described filters.

In the present specification, the above-described conductive member is an electronic member having the conductive members such as the signal extraction electrodes and is, for example, at least any one of passive elements such as a resistor element, a capacitor element, an inductive element, a filter, a switch, signal wiring, and a signal terminal and active elements such as an amplifier and a control circuit.

In the example, the conductive member that is mounted and arranged between the power amplifiers 11 and 12 and the low noise amplifier 25 may be any one of the switch circuits 51, 53, and 55, the filters 81, 85, and 86, the high pass filter 82, the duplexers 61 to 64, a metal conductor, a chip capacitor, a chip inductor, and the control circuit 90. The metal conductor has, for example, a block shape, a plate shape, or a wire shape.

In the radio frequency module 1A in the example, the filter 81, the high pass filter 82, and the duplexers 61 and 62 are mounted and arranged between the matching circuits 31 and 32 and the matching circuit 45 in the above-described plan view. More specifically, in the above-described plan view, the conductive members are mounted between an inductor (first inductor) of the matching circuit 31 connected to the output terminal of the power amplifier 11 and an inductor (second inductor) of the matching circuit 45 connected to the input terminal of the low noise amplifier 25. In the above-described plan view, the conductive members are mounted between an inductor (first inductor) of the matching circuit 32 connected to the output terminal of the power amplifier 12 and the inductor (second inductor) of the matching circuit 45 connected to the input terminal of the low noise amplifier 25. With this configuration, electromagnetic fields generated from the inductors of the matching circuits 31 and 32 can be shielded by the above-described conductive members. Therefore, electromagnetic field coupling between the inductor (first inductor) of the matching circuit 31 and the inductor (second inductor) of the matching circuit 45 can be suppressed. Interference between the transmission signals in the middle band group and the GPS reception signals can thereby be suppressed. Further, electromagnetic field coupling between the inductor (first inductor) of the matching circuit 32 and the inductor (second inductor) of the matching circuit 45 can be suppressed. Interference between the transmission signals in the high band group and the GPS reception signals can thereby be suppressed.

In the example, the conductive member that is mounted and arranged between the matching circuits 31 and 32 and the matching circuit 45 may be any one of the switch circuits 51, 53, and 55, the filters 81, 85, and 86, the high pass filter 82, the duplexers 61 to 64, a metal conductor, a chip capacitor, a chip inductor, and the control circuit 90. The metal conductor has, for example, a block shape, a plate shape, or a wire shape.

The above-described conductive member desirably has an electrode set to a ground potential or a fixed potential and is desirably connected to the ground pattern formed in the module substrate 91, for example. The electromagnetic field shielding function of the conductive member is thereby improved.

In the radio frequency module 1A in the example, a plurality of external connection terminals 150 is arranged on the main surface 91b side of the module substrate 91. The radio frequency module 1A transfers electrical signals to/from an external substrate arranged on the negative z-axis direction side of the radio frequency module 1A while passing through the plurality of external connection terminals 150. Some of the plurality of external connection terminals 150 are set to the ground potential of the external substrate. The power amplifiers 11 and 12 that are difficult to be reduced in height are not arranged on the main surface 91b of the main surfaces 91a and 91b, which faces the external substrate, and the low noise amplifiers 21, 22, and 25 and the switch circuits 51, 53 and 55 that are easily reduced in height are arranged thereon. The entire radio frequency module 1A can thereby be reduced in height. In addition, the plurality of external connection terminals 150 applied as ground electrodes is arranged around the low noise amplifiers 21, 22, and 25 that affect the reception sensitivities of the reception circuits. Deterioration in the reception sensitivities of the reception circuits can thereby be suppressed. In particular, in the radio frequency module 1A in the example, the plurality of external connection terminals 150 is arranged so as to surround the low noise amplifier 25 that amplifies the GPS reception signals. The interference of the signals in the cellular band with the GPS reception signals can thereby be further suppressed.

In the radio frequency module 1A in the example, the ground pattern is arranged in the module substrate 91 or on the surface thereof. With this configuration, since the above-described ground pattern is interposed between the power amplifiers 11 and 12 and the low noise amplifier 25, isolation between the transmission signals in the cellular band and the GPS reception signals can be further improved.

The external connection terminals 150 may be columnar electrodes penetrating through the resin member 93 in the z-axis direction or may be bump electrodes arranged on electrodes formed on the main surface 91b. When the external connection terminals 150 are the bump electrodes, the resin member 93 is not required to be provided.

In addition, the filters 81, 85, and 86, the high pass filter 82, the duplexers 61 to 64, and the matching circuits 31, 32, 41, 42, and 45 are components that are difficult to be reduced in height. Therefore, they are desirably mounted on the main surface 91a on which the power amplifiers 11 and 12 that are also difficult to be reduced in height are mounted. With this arrangement manner, the heights of the components that are mounted on the main surface 91a can be made uniform, and the heights of the components that are mounted on the main surface 91b can be made uniform. As a result, the radio frequency module 1A can be reduced in height.

Here, a circuit configuration of the power amplifier 11 will be described.

Figure 2C:
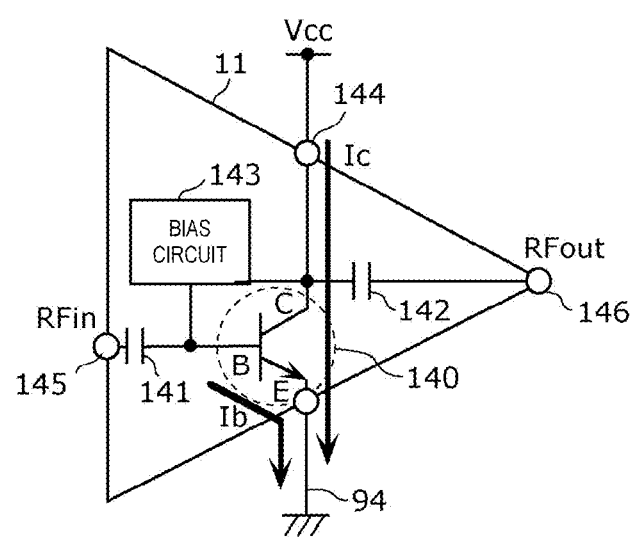
FIG. 2C is a circuit configuration diagram of a power amplifier in the example.

FIG. 2C is a circuit configuration diagram of the power amplifier 11 included in the radio frequency module 1A in the example. As illustrated in the drawing, the power amplifier 11 includes a transistor 140, capacitors 141 and 142, a bias circuit 143, a collector terminal 144, an emitter terminal, an input terminal 145, and an output terminal 146.

The transistor 140 is, for example, an emitter-grounded bipolar transistor having a collector, an emitter, and a base. The transistor 140 amplifies a radio frequency current input to the base and outputs the amplified current from the collector. Note that the transistor 140 may be a field effect transistor having a drain, a source, and a gate.

The capacitor 141 is a capacitive element for DC cutting and has a function of preventing a DC current from leaking to the input terminal 145 due to a DC bias voltage applied from the bias circuit 143 to the base.

The capacitor 142 is a capacitive element for DC cutting and has a function of removing a DC component of the radio frequency amplified signal on which the DC bias voltage has been superimposed. The radio frequency amplified signal from which the DC component has been removed is output from the output terminal 146.

The bias circuit 143 is connected to the base of the transistor 140 and has a function of optimizing an operating point of the transistor 140 by applying the bias voltage to the base.

With the above-described circuit configuration of the power amplifier 11, a radio frequency signal RFin input from the input terminal 145 becomes a base current Ib flowing from the base to the emitter of the transistor 140. The base current Ib is amplified by the transistor 140 to become a collector current Ic, and a radio frequency signal RFout corresponding to the collector current Ic is output from the output terminal 146. At this time, a large current which is the sum of the base current Ib and the collector current Ic flows from the emitter terminal to the ground.

The base terminal, the collector terminal, and the emitter terminal (ground terminal) are arranged on the main surface 91a and are formed of metallic electrode layers, metallic bump members, or the like.

As illustrated in FIG. 2B, a through electrode 94 is connected to the ground terminal of the power amplifier 11 and penetrates through between the main surface 91a and the main surface 91b. The through electrode 94 is connected to the external connection terminal 150 on the main surface 91b.

The above-described circuit configuration of the power amplifier 11 can eliminate a heat dissipation path passing through only a planar wiring pattern along an xy plane direction having a large thermal resistance in the wiring in the module substrate 91. Therefore, the small-sized radio frequency module 1A with an improved heat dissipation property from the power amplifier 11 to the external substrate can be provided.

Here, the through electrode 94 is not limited to be formed by one cylindrical via conductor reaching the main surface 91b from the main surface 91a in the module substrate 91. The through electrode 94 may have a structure in which a plurality of cylindrical via conductors is connected in series. Via-receiving electrodes along respective layers are formed between the plurality of cylindrical via conductors connected in series, and the cylindrical via conductors adjacent to each other in the z-axis direction at least partially overlap with each other when the main surface 91b is viewed in plan from the main surface 91b. That is, the through electrode 94 has no path in the xy plane direction passing through only the planar wiring pattern and necessarily has a path in the z-axis direction.

Alternatively, the power amplifiers 11 and 12 may be mounted on the main surface 91b of the module substrate 91 whereas the low noise amplifier 25 may be mounted on the main surface 91a of the module substrate 91.

Figure 3A:
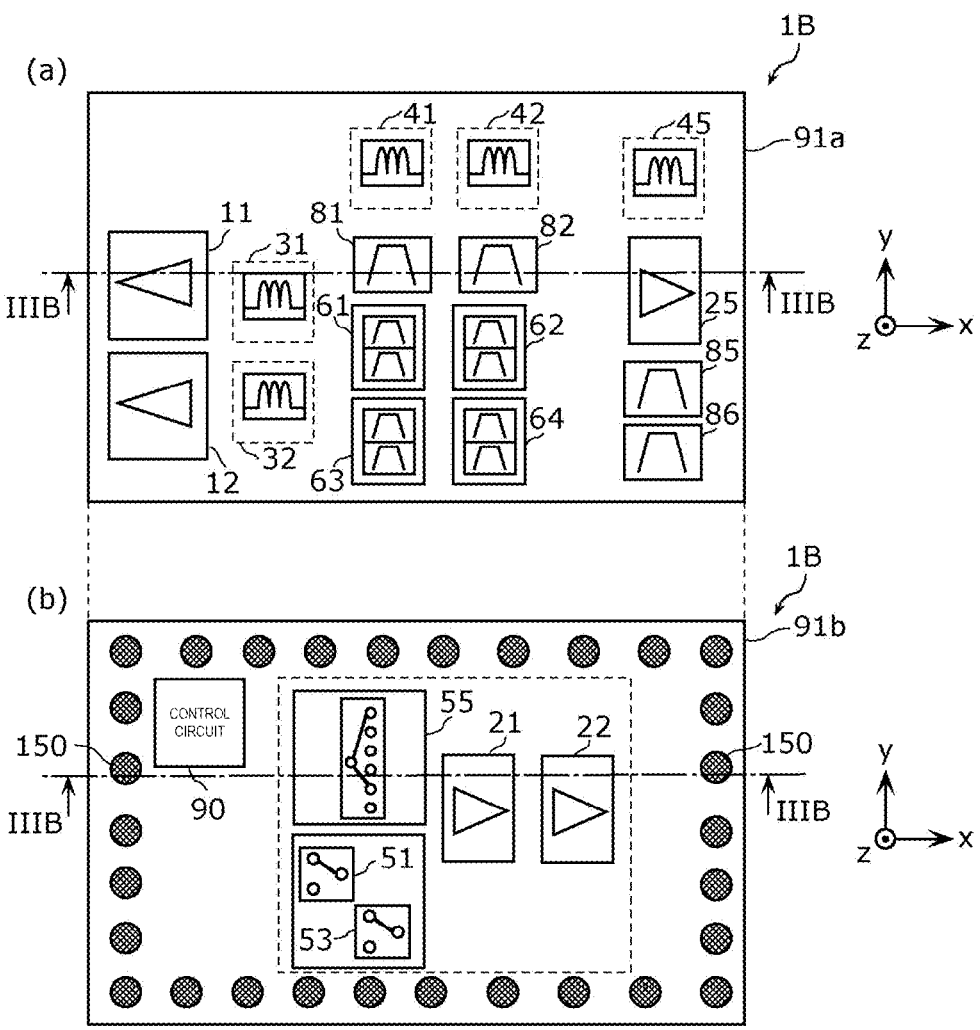
FIG. 3A is a schematic plan configuration diagram of a radio frequency module according to a variation.
Figure 3B:
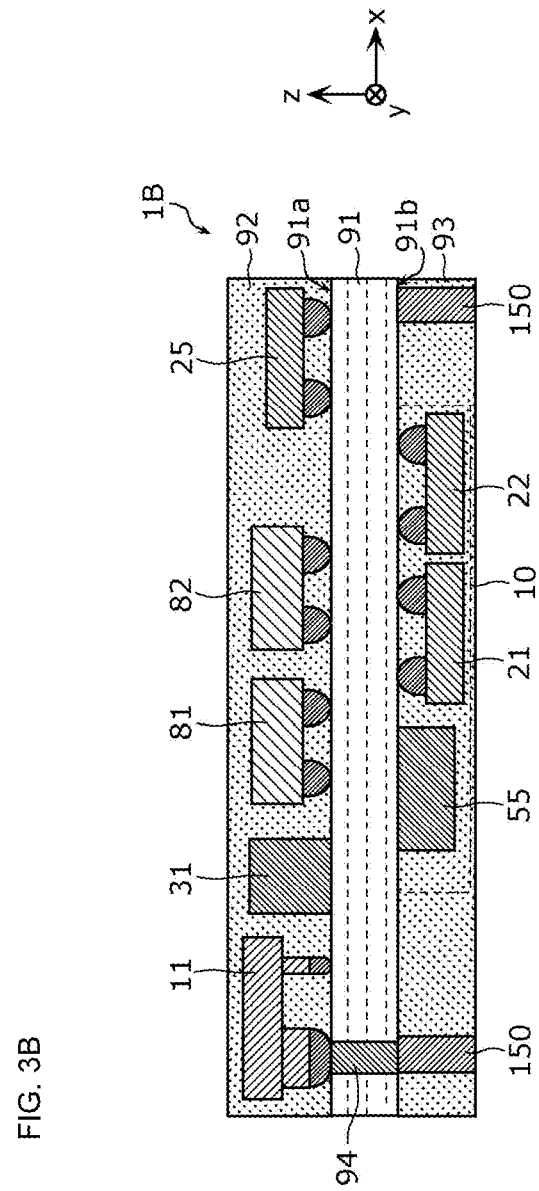
FIG. 3B is a schematic sectional configuration diagram of the radio frequency module in the variation.

3. Circuit Element Arrangement Configuration of Radio Frequency Module 1B According to Variation FIG. 3A is a schematic plan configuration diagram of a radio frequency module 1B according to a variation. FIG. 3B is a schematic sectional configuration diagram of the radio frequency module 1B in the variation, and specifically, is a sectional view along line IIIB-IIIB in FIG. 3A. (a) in FIG. 3A illustrates an arrangement diagram of circuit elements when the main surface 91a of the main surfaces 91a and 91b of the module substrate 91, which face each other, is viewed from the positive z-axis direction side. On the other hand, (b) in FIG. 3A illustrates a perspective view of arrangement of the circuit elements when the main surface 91b is viewed from the z-axis positive direction side.

In the radio frequency module 1B in the variation, the arrangement configuration of the circuit elements configuring the radio frequency module 1 in the embodiment is specifically indicated. The radio frequency module 1B in the variation is different from the radio frequency module 1A in the example only in the arrangement configuration of the circuit elements configuring the radio frequency module 1B. Hereinafter, as for the radio frequency module 1B in the variation, description of the same points as those of the radio frequency module 1A in the example will be omitted and different points will be described.

As illustrated in FIGS. 3A and 3B, the radio frequency module 1B in the variation further includes the module substrate 91 and the resin members 92 and 93 in addition to the circuit configuration illustrated in FIG. 1.

As illustrated in FIGS. 3A and 3B, in the radio frequency module 1B in the variation, the power amplifiers 11 and 12, the low noise amplifier 25, the filters 81, 85, and 86, the high pass filter 82, the duplexers 61 to 64, and the matching circuits 31, 32, 41, 42, and 45 are surface-mounted on the main surface 91a of the module substrate 91. On the other hand, the low noise amplifiers 21 and 22, the switch circuits 51, 53, and 55, and the control circuit 90 are surface-mounted on the main surface 91b of the module substrate 91. Although not illustrated in FIG. 3A and FIG. 3B, the matching circuits 71 to 74 may be surface-mounted on any one of the main surfaces 91a and 91b of the module substrate 91 or may be incorporated in the module substrate 91.

The power amplifier 11 is an example of a first transmission power amplifier that amplifies the transmission signals in the middle band group and is mounted on the main surface 91a of the module substrate 91. The power amplifier 12 is an example of the first transmission power amplifier that amplifies transmission signals in the high band group and is mounted on the main surface 91a of the module substrate 91. The low noise amplifier 25 is an example of a second reception low noise amplifier that amplifies the GPS signals and is mounted on the main surface 91a of the module substrate 91.

In the radio frequency module 1B in the variation, the filter 81, the high pass filter 82, and the duplexers 61 to 64 are examples of a conductive member and are mounted on the main surface 91a of the module substrate 91. In plan view of the module substrate 91, the filter 81, the high pass filter 82, and the duplexers 61 and 62 are arranged between the power amplifier 11 and the low noise amplifier 25. In the above-described plan view, a distance between the power amplifier 11 and the low noise amplifier 25 can therefore be largely ensured for the sizes of the above-described conductive members, so that the conductive members can be used as shield members between the power amplifier 11 and the low noise amplifier 25. Signal interference between the power amplifier 11 in the middle band group and the low noise amplifier 25 in the GPS band can thereby be suppressed. Further, in the above-described plan view, the duplexers 61 to 63 are arranged between the power amplifier 12 and the low noise amplifier 25. In the above-described plan view, a distance between the power amplifier 12 and the low noise amplifier 25 can therefore be largely ensured for the sizes of the above-described conductive members, so that the conductive members can be used as shield members between the power amplifier 12 and the low noise amplifier 25. Signal interference between the power amplifier 12 in the high band group and the low noise amplifier 25 in the GPS band can thereby be suppressed.

The conductive member that is arranged between the power amplifiers 11 and 12 and the low noise amplifier 25 may be at least one of the filter 81, the high pass filter 82, and the duplexers 61 to 64. The above-described conductive member may be at least any one of the transmission filter and the reception filter configuring each of the duplexers 61 to 64.

In the variation, the conductive member that is mounted and arranged between the power amplifiers 11 and 12 and the low noise amplifier 25 may be any one of the switch circuits 51, 53, and 55, the filters 81, 85, and 86, the high pass filter 82, the duplexers 61 to 64, a metal conductor, a chip capacitor, a chip inductor, and the control circuit 90. The metal conductor has, for example, a block shape, a plate shape, or a wire shape.

In the radio frequency module 1B in the variation, the filter 81, the high pass filter 82, and the duplexers 61 and 62 are mounted and arranged between the matching circuits 31 and 32 and the matching circuit 45 in the above-described plan view. With this configuration, electromagnetic fields generated from the inductors of the matching circuits 31 and 32 can be shielded by the above-described conductive members. Therefore, electromagnetic field coupling between the inductor (first inductor) of the matching circuit 31 and the inductor (second inductor) of the matching circuit 45 can be suppressed. Interference between the transmission signals in the middle band group and the GPS reception signals can thereby be suppressed. Further, electromagnetic field coupling between the inductor (first inductor) of the matching circuit 32 and the inductor (second inductor) of the matching circuit 45 can be suppressed. Interference between the transmission signals in the high band group and the GPS reception signals can thereby be suppressed.

In the variation, the conductive member that is mounted and arranged between the matching circuits 31 and 32 and the matching circuit 45 may be any one of the switch circuits 51, 53, and 55, the filters 81, 85, and 86, the high pass filter 82, the duplexers 61 to 64, a metal conductor, a chip capacitor, a chip inductor, and the control circuit 90. The metal conductor has, for example, a block shape, a plate shape, or a wire shape.

In the radio frequency module 1B in the variation, a plurality of external connection terminals 150 is arranged on the main surface 91b side of the module substrate 91. The radio frequency module 1B transfers electrical signals to/from an external substrate arranged on the negative z-axis direction side of the radio frequency module 1B while passing through the plurality of external connection terminals 150. Some of the plurality of external connection terminals 150 are set to a ground potential of the external substrate. The power amplifiers 11 and 12 that are difficult to be reduced in height are not arranged on the main surface 91b of the main surfaces 91a and 91b, which faces the external substrate, and the low noise amplifiers 21 and 22, the switch circuits 51, 53 and 55, and the control circuit 90 that are easily reduced in height are arranged thereon. The entire radio frequency module 1B can thereby be reduced in height. In addition, the plurality of external connection terminals 150 applied as ground electrodes is arranged around the low noise amplifiers 21 and 22 that affect the reception sensitivities of the reception circuits. Deterioration in the reception sensitivities of the reception circuits can thereby be suppressed.

The external connection terminals 150 may be columnar electrodes penetrating through the resin member 93 in the z-axis direction or may be bump electrodes arranged on electrodes formed on the main surface 91b. When the external connection terminals 150 are the bump electrodes, the resin member 93 is not required to be provided.

As illustrated in (b) of FIG. 3A, the low noise amplifiers 21 and 22 and the switch circuits 51, 53, and 55 may be incorporated in the same semiconductor IC 10. By arranging, on the main surface 91b, the semiconductor IC 10 in which these components capable of being reduced in height are incorporated, it is possible to reduce the thickness by polishing the main surface 91b side in a manufacturing process. Accordingly, the radio frequency module 1B can be reduced in height. Note that the semiconductor IC 10 may incorporate therein the control circuit 90.

4. Effects

As described above, the radio frequency module 1 according to the embodiment includes the module substrate 91 having the main surfaces 91a and 91b facing each other and enabling the radio frequency components to be mounted on both main surfaces, the first transmission power amplifier configured to amplify the transmission signals in the cellular band, and the second reception low noise amplifier configured to amplify the GPS reception signals, wherein the first transmission power amplifier and the second reception low noise amplifier are mounted on the same module substrate 91.

This configuration can provide the small-sized radio frequency module 1 as compared with a conventional configuration in which a power amplifier that amplifies transmission signals in the cellular band and a low noise amplifier that amplifies GPS reception signals are mounted on separate mounting substrates. Therefore, the small-sized radio frequency module 1 in which the transmission circuit corresponding to the cellular band and the GPS reception circuit coexist can be provided.

Further, the first transmission power amplifier may be mounted on the main surface 91a, and the second reception low noise amplifier may be mounted on the second main surface 91b.

With the above-described configuration, the radio frequency module 1 can be further reduced in size as compared with a case where the first transmission power amplifier and the second reception low noise amplifier having large mounting areas are mounted and arranged on the same mounting surface. In addition, since the module substrate 91 is interposed between the first transmission power amplifier and the second reception low noise amplifier, deterioration in the GPS reception sensitivity due to interference of high-power transmission signals in the cellular band with the GPS signals requiring high signal to noise ratios can be suppressed.

Further, the external connection terminals 150 that are connected to the external substrate may be arranged on the main surface 91b.

Thus, it is possible to suppress the deterioration in the reception sensitivity of the reception circuit including the second reception low noise amplifier mounted on the main surface 91b.

Moreover, the through electrode 94 connected to the ground terminal of the first transmission power amplifier and penetrating through between the main surface 91a and the main surface 91b of the module substrate 91 may be provided, and the through electrode 94 may be connected to the external connection terminal 150 on the main surface 91b.

This configuration can eliminate a heat dissipation path passing through only a planar wiring pattern along the main surface direction having a large thermal resistance in the wiring in the module substrate 91. Therefore, the small-sized radio frequency module 1 with an improved heat dissipation property from the first transmission power amplifier to the external substrate can be provided.

Further, the conductive member that is mounted between the first transmission power amplifier and the second reception low noise amplifier in plan view of the module substrate 91 may be provided.

With this configuration, in the above-described plan view, a distance between the first transmission power amplifier and the second reception low noise amplifier can be largely ensured for the size of the interposed conductive member, so that the conductive member can be used as a shield member between the first transmission power amplifier and the second reception low noise amplifier. Signal interference between the power amplifier in the cellular band and the low noise amplifier in the GPS band can thereby be suppressed.

Moreover, the first inductor connected to the output terminal of the first transmission power amplifier, the second inductor connected to the input terminal of the second reception low noise amplifier, and the conductive member mounted between the first inductor and the second inductor in plan view of the module substrate 91 may be further provided.

With this configuration, electromagnetic fields generated from the first inductor and the second inductor can be shielded by the above-described conductive member. Therefore, electromagnetic field coupling between the first inductor and the second inductor can be suppressed. Interference between the transmission signals in the cellular band and the GPS reception signals can thereby be suppressed.

The conductive member may be any one of (1) the antenna switch configured to switch conduction and non-conduction between the transmission path for transmitting the transmission signals in the cellular band and the antenna connection terminal, (2) the first switch configured to switch conduction and non-conduction between the above-described transmission path and the first transmission power amplifier, (3) the second switch configured to switch the reception path for transmitting the reception signals in the cellular band and the first reception low noise amplifier that amplifies the reception signals, (4) the first transmission filter arranged on the above-described transmission path, (5) the first reception filter arranged on the above-described reception path, (6) the second reception filter arranged on the GPS reception path for transmitting the GPS reception signals, (7) the third filter arranged between the antenna connection terminal and the first transmission filter and the first reception filter, (8) the metal conductor having the block shape, the plate shape, or the wire shape, (9) the chip capacitor, (10) the chip inductor, (11) the control circuit 90 configured to generate at least one of the control signal for adjusting the gain of the first transmission power amplifier or the second reception low noise amplifier and the control signals for controlling switching of the antenna switch, the first switch, and the second switch.

Further, the external connection terminals 150 that are connected to the external substrate may be arranged on the main surface 91b, and the antenna switch, the first switch, and the second switch may be mounted on the main surface 91b.

With this configuration, the power amplifiers that are difficult to be reduced in height are not arranged on the main surface 91b of the main surfaces 91a and 91b, which faces the external substrate, and the low noise amplifiers and the switch circuits that are easily reduced in height are arranged thereon. The entire radio frequency module 1 can thereby be reduced in height.

The first reception low noise amplifier is mounted on the main surface 91b, and at least one of the antenna switch, the first switch, and the second switch and the first reception low noise amplifier are incorporated in the same semiconductor IC.

This configuration further accelerates the miniaturization of the radio frequency module 1.

In addition, the external connection terminals 150 that are connected to the external substrate may be arranged on the main surface 91b, and the first transmission filter, the first reception filter, the second reception filter, the third filter, the chip capacitor, and the chip inductor may be mounted on the main surface 91a.

With this configuration, since the filter, the chip capacitor, and the chip inductor are components that are difficult to be reduced in height, it is desirable to mount them on the main surface 91a on which the power amplifiers that are also difficult to be reduced in height are mounted. With this arrangement manner, the heights of the components that are mounted on the main surface 91a can be made uniform, and the heights of the components that are mounted on the main surface 91b can be made uniform. As a result, the radio frequency module 1 can be reduced in height.

Further, the communication apparatus 5 in the embodiment includes the RFIC 3 configured to process the radio frequency signals that are transmitted and received by the antenna and the radio frequency module 1 configured to transmit the radio frequency signals between the antenna and the RFIC 3.

Therefore, the small-sized communication apparatus 5 in which the transmission circuit corresponding to the cellular band and the GPS reception circuit coexist can be provided.

Other Embodiments

Although the radio frequency module and the communication apparatus according to the embodiment of the present disclosure have been described with reference to the example and the variation, the radio frequency module and the communication apparatus according to the present disclosure are not limited to the example and the modification. Other embodiments that are realized by combining desired constituent elements in the above-described example and variation, variations that are obtained by applying various variations conceived by those skilled in the art to the above-described example and variation without departing from the gist of the disclosure and various apparatuses incorporating the radio frequency module and the communication apparatus as described above are also encompassed in the disclosure.

For example, in the radio frequency module and the communication apparatus in the example and the variation described above, another circuit element, wiring, or the like may be inserted in the path connecting the circuit elements and signal paths disclosed in the drawings.

Further, the transmission circuit corresponding to the cellular band means that when frequency-gain characteristics of an amplifier included in the transmission circuit are measured, a frequency range with a gain of equal to or more than a predetermined value includes a frequency range of one communication band belonging the cellular band. The above-described predetermined value may be, for example, a gain that is reduced by 3 dB from a maximum gain of the transmission power amplifier. Alternatively, the transmission circuit corresponding to the cellular band means that a pass band of a filter included in the transmission circuit includes a frequency range of one communication band belonging to the cellular band. Further, the transmission circuit corresponding to the cellular band means that a transmission signal output from an RFIC to the transmission circuit is included in a frequency range of one communication band belonging to the cellular band.

Further, the GPS reception circuit means that when frequency-gain characteristics of an amplifier included in the reception circuit are measured, a frequency range with a gain of equal to or more than a predetermined value includes the GPS band. The above-described predetermined value may be, for example, a gain that is reduced by 3 dB from a maximum gain of the transmission power amplifier. Alternatively, the GPS reception circuit means that a pass band of a filter included in the reception circuit includes the GPS band.

INDUSTRIAL APPLICABILITY

The disclosure can be widely used in communication apparatuses such as cellular phones as a radio frequency module arranged in a multiband front-end unit.

REFERENCE SIGNS LIST 1, 1A, 1B RADIO FREQUENCY MODULE
1G GPS CIRCUIT
1H HIGH BAND CIRCUIT
1M MIDDLE BAND CIRCUIT
2G, 2H, 2M ANTENNA
3 RF SIGNAL PROCESSING CIRCUIT (RFIC)
4 BASEBAND SIGNAL PROCESSING CIRCUIT (BBIC)
5 COMMUNICATION APPARATUS
10 SEMICONDUCTOR IC
11, 12 POWER AMPLIFIER
21, 22, 25 LOW NOISE AMPLIFIER
31, 32, 41, 42, 45, 71, 72, 73, 74 MATCHING CIRCUIT
51, 53, 55 SWITCH CIRCUIT
51a, 51b, 53a, 53b, 55a, 55b SWITCH
61, 62, 63, 64 DUPLEXER
61R, 62R, 63R, 64R RECEPTION FILTER
61T, 62T, 63T, 64T TRANSMISSION FILTER
81, 85, 86 FILTER
82 HIGH PASS FILTER
90 CONTROL CIRCUIT
91 MODULE SUBSTRATE
91a, 91b MAIN SURFACE
92, 93 RESIN MEMBER
94 THROUGH ELECTRODE
101, 102, 105 ANTENNA CONNECTION TERMINAL
111, 112 TRANSMISSION INPUT TERMINAL
121, 122, 125 RECEPTION OUTPUT TERMINAL
140 TRANSISTOR
141, 142 CAPACITOR
143 BIAS CIRCUIT
144 COLLECTOR TERMINAL
145 INPUT TERMINAL
146 OUTPUT TERMINAL
150 EXTERNAL CONNECTION TERMINAL

The invention claimed is:

1. A radio frequency module, comprising:
a mounting substrate having a first main surface and a second main surface that face each other;
a first transmission power amplifier configured to amplify a transmission signal in a cellular band; and
a second reception low noise amplifier configured to amplify a global positioning system (GPS) reception signal, wherein
the first transmission power amplifier is mounted on the first main surface, and
the second reception low noise amplifier is mounted on the second main surface.

2. The radio frequency module according to claim 1, wherein an external connection terminal, connected to an external substrate, is arranged on the second main surface.

3. The radio frequency module according to claim 2, further comprising:
a through electrode connected to a ground terminal of the first transmission power amplifier, the through electrode passing between the first main surface and the second main surface of the mounting substrate, wherein
the through electrode is connected to the external connection terminal on the second main surface.

4. A communication apparatus, comprising:
an RF signal processing circuit configured to process a radio frequency signal that is transmitted and received by an antenna; and
the radio frequency module according to claim 1, wherein
the radio frequency module is configured to transmit the radio frequency signal between the antenna and the RF signal processing circuit.

5. The radio frequency module according to claim 1, further comprising:
a conductor arranged between the first transmission power amplifier and the second reception low noise amplifier in a plan view of the mounting substrate.

6. The radio frequency module according to claim 1, further comprising:
a first inductor connected to an output terminal of the first transmission power amplifier;
a second inductor connected to an input terminal of the second reception low noise amplifier; and
a conductor mounted between the first inductor and the second inductor in a plan view of the mounting substrate.

7. A radio frequency module, comprising:
a mounting substrate having a first main surface and a second main surface that face each other;
a first transmission power amplifier mounted on the first main surface of the mounting substrate, the first transmission power amplifier configured to amplify a transmission signal in a cellular band;
a second reception low noise amplifier mounted on the second main surface of the mounting substrate, the second reception low amplifier configured to amplify a global positioning system (GPS) reception signal; and
a conductor arranged between the first transmission power amplifier and the second reception low noise amplifier in a plan view of the mounting substrate.

8. The radio frequency module according to claim 7, wherein an external connection terminal, connected to an external substrate, is arranged on the second main surface.

9. The radio frequency module according to claim 8, further comprising:
a through electrode connected to a ground terminal of the first transmission power amplifier, the through electrode passing between the first main surface and the second main surface of the mounting substrate, wherein
the through electrode is connected to the external connection terminal on the second main surface.

10. The radio frequency module according to claim 7, further comprising:
a first inductor connected to an output terminal of the first transmission power amplifier;
a second inductor connected to an input terminal of the second reception low noise amplifier; and
a conductor mounted between the first inductor and the second inductor in a plan view of the mounting substrate.

11. A radio frequency module, comprising:
a mounting substrate having a first main surface and a second main surface that face each other;
a first transmission power amplifier mounted on the first main surface of the mounting substrate, the first transmission power amplifier configured to amplify a transmission signal in a cellular band;
a second reception low noise amplifier mounted on the second main surface of the mounting substrate, the second reception low amplifier configured to amplify a global positioning system (GPS) reception signal;
a first inductor connected to an output terminal of the first transmission power amplifier;
a second inductor connected to an input terminal of the second reception low noise amplifier; and
a conductor mounted between the first inductor and the second inductor in a plan view of the mounting substrate.

12. The radio frequency module according to claim 11, wherein the conductor is any one of:
   (1) an antenna switch configured to switch conduction and non-conduction between a transmission path, for transmitting the transmission signal in the cellular band, and an antenna connection terminal;
   (2) a first switch configured to switch conduction and non-conduction between the transmission path and the first transmission power amplifier;
   (3) a second switch configured to switch conduction and non-conduction between a reception path, for a reception signal in the cellular band, and a first reception low noise amplifier that amplifies the reception signal;
   (4) a first transmission filter arranged on the transmission path;
   (5) a first reception filter arranged on the reception path;
   (6) a second reception filter arranged on a GPS reception path for transmitting the GPS reception signal;
   (7) a third filter arranged between the antenna connection terminal and the first transmission filter and the first reception filter;
   (8) a metal conductor having a block shape, a plate shape, or a wire shape;
   (9) a chip capacitor;
   (10) a chip inductor; or
   (11) a control circuit configured to generate at least one of a control signal, for adjusting a gain of the first transmission power amplifier or the second reception low noise amplifier, and control signals for controlling switching of the antenna switch, the first switch, and the second switch.

13. The radio frequency module according to claim 12, wherein
   an external connection terminal, which is connected to an external substrate, is arranged on the second main surface, and
   the conductor is mounted on the second main surface.

14. The radio frequency module according to claim 13, wherein
   the first reception low noise amplifier is mounted on the second main surface, and
   at least one of the antenna switch, the first switch, and the second switch and the first reception low noise amplifier are incorporated in a same semiconductor integrated circuit (IC).

15. The radio frequency module according to claim 12, wherein
   an external connection terminal, which is connected to an external substrate, is arranged on the second main surface, and
   the first transmission filter, the first reception filter, the second reception filter, the third filter, the chip capacitor, and the chip inductor are mounted on the first main surface.

16. The radio frequency module according to claim 11, wherein the conductor is any one of:
   (1) an antenna switch configured to switch conduction and non-conduction between a transmission path, for transmitting the transmission signal in the cellular band, and an antenna connection terminal;
   (2) a first switch configured to switch conduction and non-conduction between the transmission path and the first transmission power amplifier, or
   (3) a second switch configured to switch conduction and non-conduction between a reception path, for a reception signal in the cellular band, and a first reception low noise amplifier that amplifies the reception signal.

17. The radio frequency module according to claim 16, wherein
   an external connection terminal, which is connected to an external substrate, is arranged on the second main surface, and
   any of the antenna switch, the first switch, or the second switch are mounted on the second main surface.

18. The radio frequency module according to claim 11, wherein an external connection terminal, connected to an external substrate, is arranged on the second main surface.

19. The radio frequency module according to claim 18, further comprising:
   a through electrode connected to a ground terminal of the first transmission power amplifier, the through electrode passing between the first main surface and the second main surface of the mounting substrate, wherein the through electrode is connected to the external connection terminal on the second main surface.

* * * * *